United States Patent
Inoue

(10) Patent No.: US 7,268,380 B2
(45) Date of Patent: Sep. 11, 2007

(54) SEMICONDUCTOR DEVICE AND METHOD OF MANUFACTURING THE SAME

(75) Inventor: Tomoko Inoue, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/941,950

(22) Filed: Sep. 16, 2004

(65) Prior Publication Data

US 2005/0056874 A1 Mar. 17, 2005

(30) Foreign Application Priority Data

Sep. 17, 2003 (JP) .............................. 2003-324953

(51) Int. Cl.
*H01L 27/108* (2006.01)
*H01L 29/76* (2006.01)
*H01L 29/94* (2006.01)
*H01L 31/119* (2006.01)

(52) U.S. Cl. ................ 257/296; 257/306; 257/303; 257/310

(58) Field of Classification Search ................ 257/306, 257/296, 302–304, 310
See application file for complete search history.

(56) References Cited

U.S. PATENT DOCUMENTS 6,281,535 B1 * 8/2001 Ma et al. ..................... 257/295
6,406,968 B1 * 6/2002 Chien et al. ................. 438/381

FOREIGN PATENT DOCUMENTS

JP 2001-015705 1/2001

* cited by examiner

*Primary Examiner*—Chuong A. Luu
(74) *Attorney, Agent, or Firm*—Young & Thompson

(57) ABSTRACT

The present invention provides a method of increasing designing freedom of a position to form a capacitor, and increasing a capacitance value thereof. When forming a first contact, a tungsten plug for increasing a surface area of a lower electrode is formed in a contact interlayer film at a region where the capacitor is to be formed. Since the tungsten plug does not have to be formed right above the capacitor contact, a position to form the capacitor is not limited by a position where the capacitor contact is provided.

10 Claims, 5 Drawing Sheets

MEMORY CELL TRANSISTOR

PRIOR ART

SEMICONDUCTOR DEVICE AND METHOD OF MANUFACTURING THE SAME

This application is based on Japanese patent application No. 2003-324953, the content of which is incorporated hereinto by reference.

BACKGROUND OF THE INVENTION

1. Field of the Invention

The present invention is related to a semiconductor device and a method of manufacturing the semiconductor device.

2. Description of the Related Art

A memory cell constituting a DRAM (Dynamic Random Access Memory) generally includes a memory cell transistor and a capacitor. With an object to increase an integration level of the memory cell, a COB (Capacitor Over Bit line) type DRAM in which a capacitor of the DRAM is located in an upper layer of a bit line has been proposed. FIG. 10 shows a constitution of such COB type DRAM.

In this DRAM a MOS transistor formed on a semiconductor substrate, in FIG. 10 a silicon substrate 10, is serving as a memory cell transistor. In an upper layer of the memory cell transistor, a bit line 6 is formed via a cell contact interlayer film 8, and in an upper layer of the bit line 6, a capacitor 11 is formed via a capacitor contact interlayer film 7. The capacitor 11 is formed for example in a cylindrical shape through a film 12 located on the capacitor contact interlayer film 7 and a contact interlayer film 13. The bit line 6 is connected to a cell contact 9 via a barrier metal layer 5, thereby achieving a connection to the memory cell transistor formed on the silicon substrate 10, and the capacitor 11 is connected to the memory cell transistor formed on the silicon substrate 10 via the capacitor contact 4 and the cell contact 9.

FIG. 11 shows a detailed structure around the capacitor 11 of FIG. 10. As shown in FIG. 11, the capacitor 11 includes a lower electrode 14, a capacitance layer 15 and an upper electrode 16. And a contact 17, connecting a metal interconnect 18 formed on the contact interlayer film 13 to a capacitor contact 4 or the upper electrode 16, is provided on the contact interlayer film 13.

A DRAM constituted as above facilitates increasing an integration level, since the capacitor 11 is provided in an upper layer of the memory cell transistor.

In turn, along with the achievement of a higher integration level of semiconductor devices through these years, further micronization of a contact size has been required. As a matter of fact, a contact, which used to be approx. 0.2 μm in diameter, is currently as fine as 0.12 μm in diameter. For such reason, recently an ArF (Argon Fluoride) stepper has come to be more widely used for pattern transfer, in place of a KrF (Krypton Fluoride) stepper. Since uses a light of a shorter wavelength than that of a KrF stepper, an ArF stepper can perform a finer exposure. For example, an ArF stepper uses an excimer laser of 193 nm in wavelength, while a KrF stepper uses an excimer laser of 248 nm in wavelength.

On the other hand, a photo resist used for an ArF exposure has a less chemical resistance than a one used in a KrF exposure. Therefore, it is difficult to form a deep contact hole when using an ArF stepper.

Accordingly, in case of using an ArF stepper to manufacture a semiconductor device of such a structure as shown in FIG. 11, the contact 17 can only be formed in a lower height, and the capacitor 11 also becomes lower. When the capacitor 11 is lower, a surface area of the lower electrode 14 and the upper electrode 16 is reduced, which results in a decrease of a capacitance value of the capacitor 11.

Further, a decrease in a capacitance value of a memory cell makes it difficult for the device to perform stably, thereby degrading reliability of the device. Therefore, maintaining the capacitance value of a memory cell at a certain level, despite the increase in integration level, constitutes a key issue.

To achieve such a goal, for example JP-A Laid Open No. 2001-15705 discloses a semiconductor device provided with a capacitor contact formed inside an opening in which a capacitor is to be formed, so as to increase a surface area of a lower electrode, to thereby increase a capacitance value.

In case of such a semiconductor device, since a capacitor contact is formed inside an opening for increasing a surface area of a lower electrode, a position where the capacitor may be located depends on a position of the capacitor contact. Besides, in order to prevent a short circuit between a bit line and the capacitor contact, the capacitor contact has to be formed in the middle between bit lines. Therefore, a position where the capacitor contact may be disposed is limited. Consequently, according to a conventional technique as cited above, a position to form a capacitor is limited, which requires a significant compromise in designing freedom of the semiconductor device.

SUMMARY OF THE INVENTION

It has now been discovered that according to the foregoing conventional method of manufacturing a semiconductor device, since a capacitor contact is formed inside an opening for the purpose of increasing a capacitance value, a position to form a capacitor is determined by a position of the capacitor contact.

Accordingly, it is an object of the present invention to provide a semiconductor device wherein a capacitance value can be increased without a compromise in designing a position of a capacitor, and a method of manufacturing such a semiconductor device.

According to the present invention, there is provided a method of manufacturing a semiconductor device including forming a capacitor on a transistor formed on a semiconductor substrate for connection to the transistor, comprising forming a transistor on a semiconductor substrate; forming a first interlayer dielectric film on the transistor; forming a plurality of first conductive plugs to be connected to the transistor in the first interlayer dielectric film; forming a second interlayer dielectric film on the first interlayer dielectric film so as to cover the first conductive plug; forming a second conductive plug to be connected to a conductive plug among the plurality of first conductive plugs in the second interlayer dielectric film; forming a capacitor to be connected to another conductive plug among the plurality of first conductive plugs than the conductive plug in the second interlayer dielectric film; forming a third interlayer dielectric film on the second interlayer dielectric film so as to cover the second conductive plug and the capacitor; and forming a plurality of third conductive plugs to be respectively connected to the second conductive plug and the capacitor in the third interlayer dielectric film.

According to the present invention, the second conductive plug and the third conductive plug for electrically connecting the first conductive plug and an interconnect etc. formed on the third interlayer dielectric film are formed in a "double stack" structure. Such arrangement permits increasing an integration level of the semiconductor device, as well as securing a sufficient height of the capacitor even though it may be difficult to form a deep contact hole. As a result, a desired capacitance value can be maintained.

Also, positioning of the capacitor and the first conductive plug is not particularly limited provided that an electric connection can be secured between the capacitor and the first conductive plug. Therefore, higher designing freedom is granted in disposing the capacitor.

Also, according to the present invention there is provided a semiconductor device comprising a semiconductor substrate; a transistor formed on the semiconductor substrate; a first interlayer dielectric film formed on the transistor; a plurality of first conductive plugs to be connected to the transistor formed in the first interlayer dielectric film; a second interlayer dielectric film formed on the first interlayer dielectric film; a second conductive plug to be connected to a conductive plug among the plurality of first conductive plugs in the second interlayer dielectric film; a capacitor to be connected to another conductive plug among the plurality of first conductive plugs than the conductive plug in the second interlayer dielectric film; a third interlayer dielectric film formed on the second interlayer dielectric film; and a plurality of third conductive plugs to be respectively connected to the second conductive plug and the capacitor formed in the third interlayer dielectric film.

According to the present invention, a conductor such as a metal plug is formed in advance in the second interlayer dielectric film, which is where the capacitor is to be formed. Such constitution permits increasing a surface area of a lower electrode of the capacitor, and thus increasing a capacitance value of the capacitor.

Also, since the conductor such as a metal plug is provided for the purpose of increasing a surface area of the lower electrode, the conductor does not have to be directly connected to the first conductive plug, which eliminates the need to dispose the capacitor right above the first conductive plug. Accordingly, positioning of the capacitor and the first conductive plug is not particularly limited as long as an electric connection, including an indirect connection, can be secured between the capacitor and the first conductive plug. Therefore, higher designing freedom is granted in disposing the capacitor.

In addition, since the conductor such as a metal plug is formed in the same step as forming the second conductive plug at a time, the number of processes does not increase at all.

As described above, according to the present invention, a capacitance value can be increased, while securing a high degree of freedom in designing a position of the capacitor.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Now referring to the accompanying drawings, embodiments of the present invention will be described in details hereunder.

First Embodiment

Figure 1:
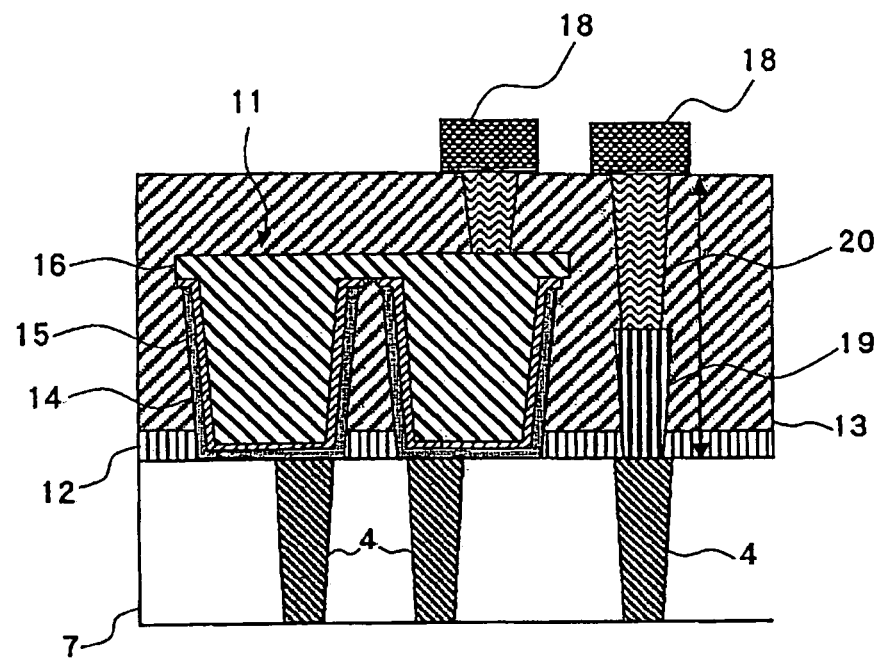
FIG. 1 is a cross-sectional drawing showing a constitution of a semiconductor device according to a first embodiment of the present invention.
Figure 10:
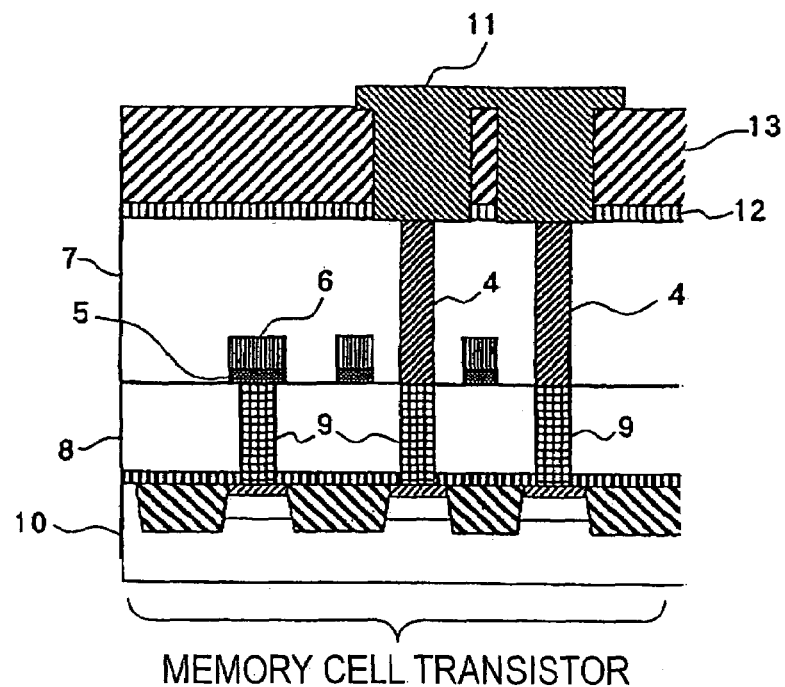
FIG. 10 is a cross-sectional drawing showing a constitution of a DRAM provided with a capacitor formed in an upper layer of a bit line.
Figure 11:
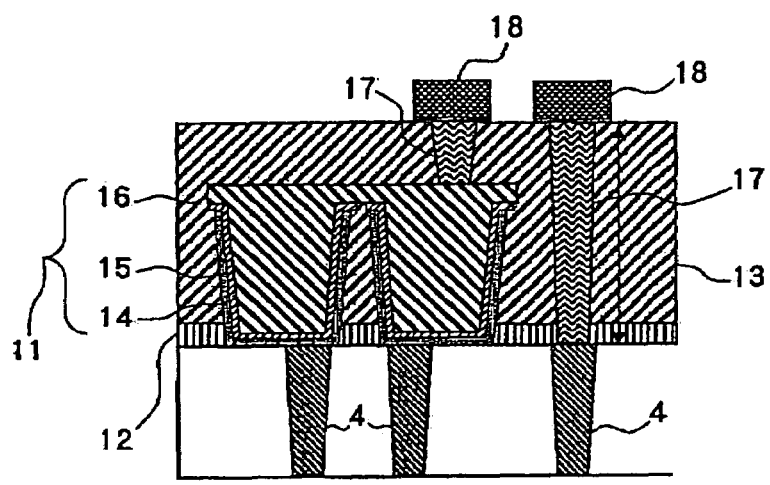
FIG. 11 is a cross-sectional drawing showing a constitution of a conventional semiconductor device.

FIG. 1 is a cross-sectional drawing showing a constitution of a semiconductor device according to a first embodiment of the present invention. In FIG. 1, the same constituent as those in FIG. 11 are given an identical numeral, and description thereof will be omitted. Also, throughout the subsequent passages, a region around the capacitor 11 of FIG. 10 will be referred to, as in the description of FIG. 11.

In the conventional semiconductor device shown in FIG. 11, the metal interconnect 18 and the capacitor contact 4 are connected via a single contact 17. On the other hand, in a semiconductor device according to this embodiment shown in FIG. 1, two contacts, namely a first contact 19 and a second contact 20, are formed in double stack for connecting the metal interconnect 18 and the capacitor contact 4.

Forming the first and the second contacts 19, 20 in double stack as in this embodiment permits increasing an integration level of the semiconductor device, as well as securing a sufficient height of the capacitor 11 even though it may be difficult to form a deep contact hole. As a result, a desired capacitance value can be maintained. Also referring to a location of the capacitor contact 4 and the capacitor 11, the capacitor 11 does not have to be provided right above the capacitor contact 4 as long as electric connection can be secured therebetween. Accordingly, positioning of the capacitor contact 4 and the capacitor 11 is not particularly limited provided that they are within a region where an electric connection can be secured, and a position to for the capacitor 11 can be selected as desired.

In addition, while this embodiment refers to a case where the contact is constituted in double stack for increasing a capacitance value of the capacitor 11, the present invention is not limited to the double stack structure, but is duly effective in case of forming the contact in triple stack or more.

Referring to a method of manufacturing the semiconductor device according to this embodiment, since the description would be a duplication of that on a method of manufacturing a semiconductor device according to a second embodiment, the description on the manufacturing method according to the first embodiment will be incorporated in the subsequent description on the second embodiment.

Second Embodiment

Now a semiconductor device according to the second embodiment of the present invention will be described.

Figure 2:
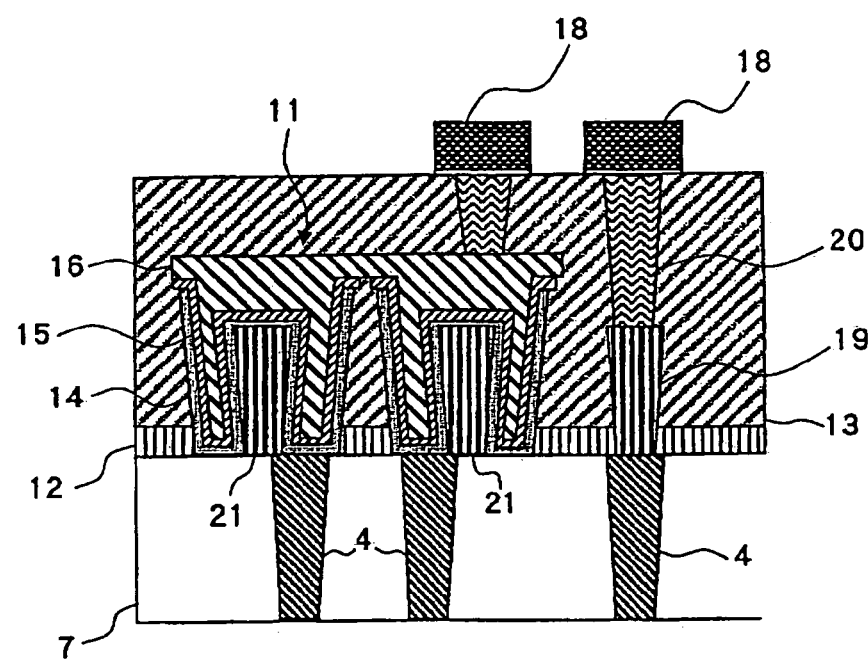
FIG. 2 is a cross-sectional drawing showing a constitution of a semiconductor device according to a second embodiment of the present invention.

FIG. 2 is a cross-sectional drawing showing a constitution of a semiconductor device according to a second embodiment of the present invention. In FIG. 2 also, the same constituent as those in FIG. 1 are given an identical numeral, and description thereof will be omitted.

The semiconductor device according to this embodiment is different from that of the first embodiment as shown in FIG. 1, in that a tungsten plug 21 is formed in advance in the same step of forming the first contact 19 at a time, in a region of the contact interlayer film 13 where the capacitor 11 is to be located, so as to increase a surface area of the lower electrode 14 of the capacitor 11, and to thus increase a capacitance value. Here, since the tungsten plug 21 is to be formed in the same step as the first contact 19 at a time, the tungsten plug 21 and the first contact 19 are both constituted of a same material, namely tungsten.

Hereunder, a method of manufacturing the semiconductor device according to this embodiment will be described referring to FIGS. 2 through 9.

Figure 3:
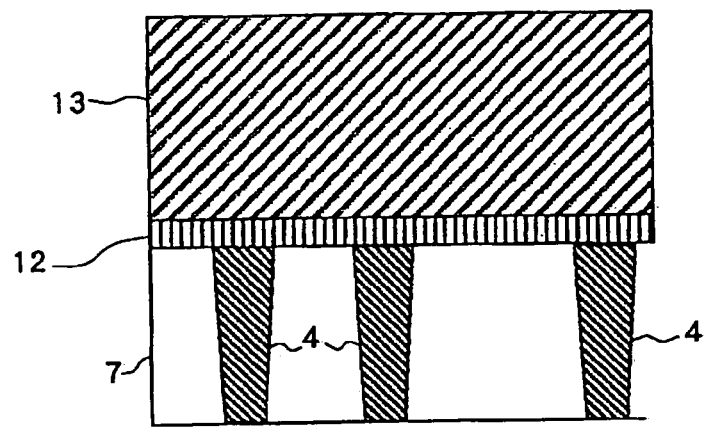
FIG. 3 is a cross-sectional drawing for explaining a method of manufacturing the semiconductor device according to the second embodiment.

Referring to FIG. 3 to start with, a film 12 constituted of SiN, SiC, SiON, SiCN etc. in a thickness of 20 to 60 nm is formed on the capacitor contact interlayer film 7, so as to cover the capacitor contact 4. This film 12 serves as an etch-stopper layer. Then, an oxide layer (dielectric layer) having a thickness of 300 to 700 nm is formed, which constitutes the contact interlayer film 13.

Figure 4:
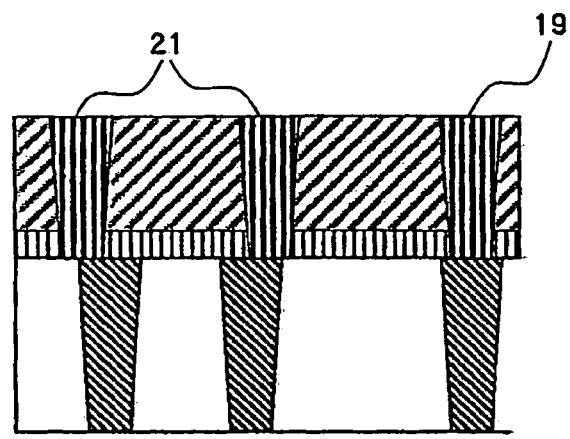
FIG. 4 is a cross-sectional drawing for explaining a method of manufacturing the semiconductor device according to the second embodiment.

Proceeding to FIG. 4, an etching process is performed to open contact holes in the contact interlayer film 13, for forming therein the first contact 19 and the tungsten plug 21. In the contact holes, W (tungsten) is deposited by CVD (Chemical Vapor Deposition) until the contact holes are completely filled. Then a CMP (Chemical Mechanical Polishing) process is performed to planarize a surface of the contact interlayer film 13, so that W remains only in the contact holes, to thereby constitute the first contact 19 and the tungsten plug 21.

In this process, the foregoing semiconductor device of the first embodiment is obtained in case of exclusively forming the first contact 19 instead of forming also the tungsten plug 21, at the positions intended for forming the capacitor 11.

Figure 5:
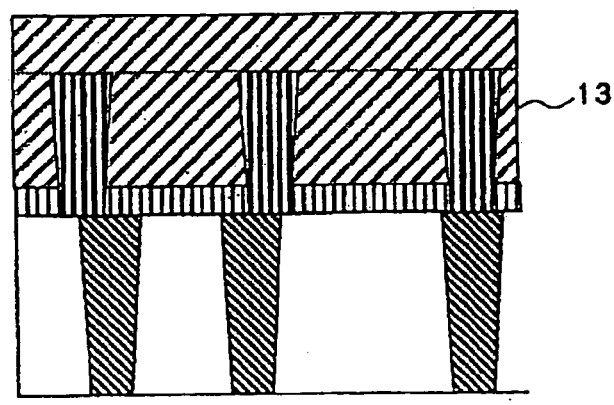
FIG. 5 is a cross-sectional drawing for explaining a method of manufacturing the semiconductor device according to the second embodiment.
Figure 6:
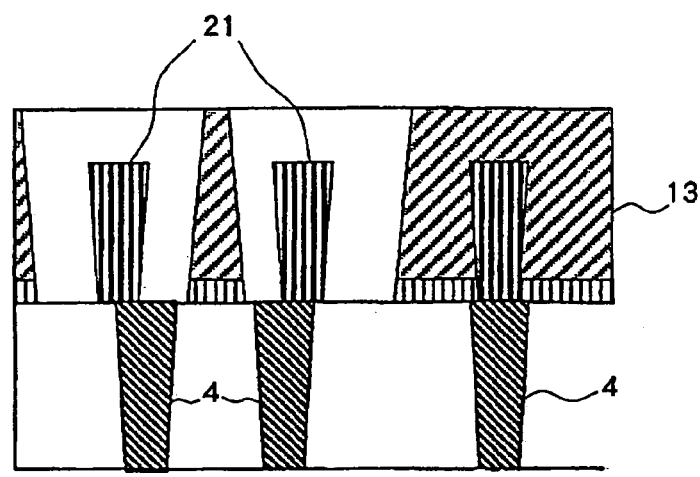
FIG. 6 is a cross-sectional drawing for explaining a method of manufacturing the semiconductor device according to the second embodiment.

Thereafter, as shown in FIG. 5, the contact interlayer film 13 is additionally formed so that a thickness is increased by 50 to 500 nm. And as shown in FIG. 6, an opening is formed in the interlayer film 13, at a position where the capacitor 11 is to be formed. As a result of forming such opening, an entirety of the tungsten plug 21 and an upper end face of the capacitor contact 4 are exposed on a bottom face of the opening. Here, the opening may be made in various shapes including a cylindrical shape having a circular cross-section when viewed from above, and those which present a hexagonal, rectangular or oval cross-section when viewed from above.

Figure 7:
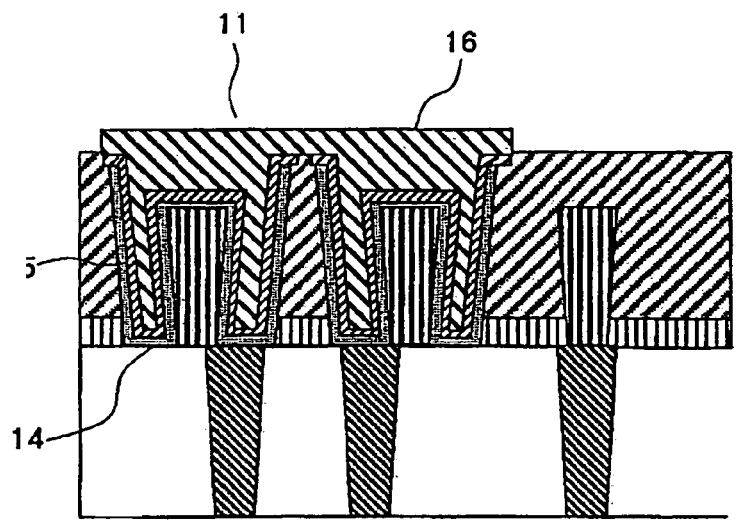
FIG. 7 is a cross-sectional drawing for explaining a method of manufacturing the semiconductor device according to the second embodiment.

Then referring to FIG. 7, a TiN film is formed all over including inside the opening, and after covering only a region of the opening with a photo resist (not shown), an etching process is performed so that the TiN film only remains inside the opening, thus constituting the lower electrode 14. Further, after forming a dielectric layer such as a Ta oxide layer on a surface of the lower electrode 14, a lamination of W and TiN is formed so as to fill in the opening, and the capacitance layer 15 and the upper electrode 16 are respectively formed, through forming a predetermined pattern of the lamination and the dielectric layer. At this stage, the capacitor 11 has been obtained.

Figure 8:
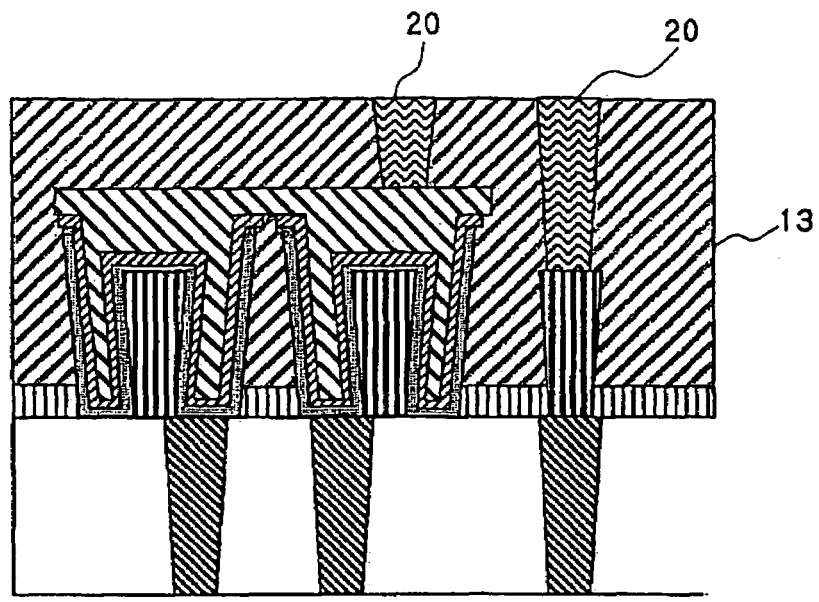
FIG. 8 is a cross-sectional drawing for explaining a method of manufacturing the semiconductor device according to the second embodiment.

Now as shown in FIG. 8, the contact interlayer film 13 is additionally deposited and the capacitor 11 is covered therewith, and then the second contact 20, which is the final contact to be provided, is formed in the contact interlayer film 13 through a process similar to the formation of the first contact 19.

Figure 9:
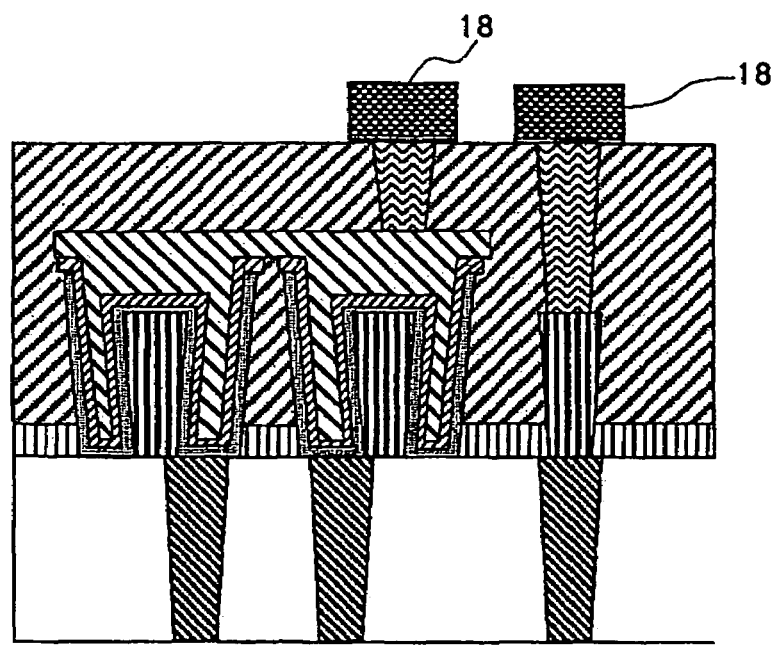
FIG. 9 is a cross-sectional drawing for explaining a method of manufacturing the semiconductor device according to the second embodiment.

Finally, as shown in FIG. 9, the metal interconnect 18 is formed so as to be connected to the second contact 20.

In the semiconductor device according to this embodiment, providing the tungsten plug 21 in the opening intended for forming the capacitor 11 therein permits increasing a surface area of the lower electrode 14. Naturally, a capacitance value of the capacitor 11 also increases along with the increase of a surface area of the lower electrode 14. Consequently, providing the tungsten plug 21 in the opening where the capacitor 11 is to be formed as this embodiment permits increasing a capacitance value of the capacitor 11, thereby improving a memory storage characteristic.

A surface area of the lower electrode 14 increases, based on a simple calculation, by an amount corresponding to a lateral area of the tungsten plug 21 of a cylindrical shape. For example, in case where the capacitor his of a cylindrical shape with a radius of 0.2 μm and a height of 0.5 μm, and the tungsten plug 21 is also a column having a radius of 0.1 μm and a height of 0.3 μm, an increase of the surface area of the lower electrode 14 can be calculated as follows.

(1) Surface area with the tungsten plug 21:

$(2p \times p \times 0.2 \times 0.5 + 0.2^2 p) + (2p \times 0.1 \times 0.3) = 0.942 \mu m^2$ (2) Surface area without the tungsten plug 21:

$(2p \times 0.2 \times 0.5 + 0.2^2 p) = 0.7536 \mu m^2$

Since 0.942/0.7536 gives 1.25, it is to be understood that in such a case the surface area of the lower electrode 14 increases by 25%, compared to a case where the tungsten plug 21 is not provided.

Also, in the semiconductor device according to this embodiment, since it is only for the purpose of increasing a surface area of the lower electrode 14 that the tungsten plug 21 is provided, the tungsten plug 21 does not have to be electrically connected to the capacitor contact 4. Accordingly, as long as an electric connection can be secured between the capacitor contact 4 and the capacitor 11, the capacitor 11 does not have to be located right above the capacitor contact 4, and the tungsten plug 21 can be disposed at a different position from the capacitor contact 4 as shown in FIG. 2. Consequently, the positioning of the capacitor 11 and the capacitor contact 4 is free from limitation, and the capacitor 11 can be disposed at a desired position.

Further, according to this embodiment, since the tungsten plug 21 is formed in the same step as forming the first contact 19 at a time in a region where the capacitor 11 is to be formed, the number of processes do not increase at all.

Meanwhile, since this embodiment refers to a case where the first contact 19 is constituted of tungsten, the tungsten plug 21 is formed under the lower electrode 14 in the capacitor 11. However, in case where the first contact 19 is to be constituted of another metal, it is appropriate to utilize the same material as the first contact 19 as a metal plug to be provided under the lower electrode 14 in the capacitor 11.

Also, while in this embodiment the first contact 19 and the tungsten plug 21 are formed in a same shape, the present invention is not limited to such configuration. A shape of the tungsten plug 21 may be formed, in addition to a cylindrical shape, in a slitted shape having a rectangular or square cross-section when viewed from above. In this way, provided that the first contact 19 and the tungsten plug 21 are constituted of a same material, they may be formed in a mutually different shape.

Basically, an object of forming the tungsten plug 21 is to increase a surface area of the lower electrode 14 to thereby increase a capacitance value. Accordingly, it is more effective to form the tungsten plug 21 in such a shape that can efficiently increase a surface area of the lower electrode 14. From such viewpoint, not only a single tungsten plug 21, but instead a plurality of tungsten plugs 21 may be formed in the opening.

Furthermore, while the foregoing first and second embodiment refer to a COB type DRAM in which a capacitor is provided in an upper layer of a bit line, the present invention is not limited to such configuration, but is equally applicable to a CUB (Capacitor Under Bit line) type DRAM in which a capacitor is provided in a lower layer of a bit line. In case of applying the present invention to such a CUB type DRAM, the only difference is that a bit line is provided in place of the metal interconnect 18 in a structure as shown in FIGS. 1 and 2, and a method of manufacturing as well as the advantage to be attained remain unchanged.

To summarize in different terms, the present invention provides a method of manufacturing a semiconductor device including forming a capacitor on a transistor formed on a semiconductor substrate for electric connection to the transistor, comprising forming a capacitor contact interlayer film in a lower layer where the capacitor is to be provided; forming a capacitor contact in the capacitor contact interlayer film; forming a contact interlayer film on the capacitor contact interlayer film so as to cover the capacitor contact; forming a first contact to be connected to the capacitor contact in the contact interlayer film; additionally depositing the contact interlayer film so as to cover the first contact; forming an opening for forming therein the capacitor in the contact interlayer film; forming a lower electrode inside the opening; sequentially forming a capacitance layer and an upper electrode on a surface of the lower electrode so as to form the capacitor; additionally depositing the contact interlayer film so as to cover the capacitor; and forming a second contact to be connected to the first contact in the added contact interlayer film.

Also, in another method of manufacturing a semiconductor device according to the present invention, a metal plug is formed in the same step of forming the first contact, in a region of the contact interlayer film where the capacitor is to be provided.

Such metal plug may be formed in a same shape as that of the first contact, or in a different shape from that of the first contact. Further, the metal plug may be formed in a cylindrical shape, or in a slitted shape having a rectangular or square cross-section when viewed from above.

It is apparent that the present invention is not limited to the above embodiment, that may be modified and changed without departing from the scope and spirit of the invention.

What is claimed is:

1. A semiconductor device comprising:
a semiconductor substrate;
a transistor formed on said semiconductor substrate;
a first interlayer dielectric film formed on said transistor;
a plurality of first conductive plugs to be connected to said transistor formed in said first interlayer dielectric film;
a second interlayer dielectric film formed on said first interlayer dielectric film;
a second conductive plug directly connected to a conductive plug among said plurality of first conductive plugs in said second interlayer dielectric film;
a capacitor directly connected to another conductive plug among said plurality of first conductive plugs other than said conductive plug in said second interlayer dielectric film;
a third interlayer dielectric film formed on said second interlayer dielectric film; and
a plurality of third conductive plugs to be respectively connected to said second conductive plug and said capacitor formed in said third interlayer dielectric film.

2. The semiconductor device as recited in claim 1, further comprising:
a conductor constituted of a same material as that of said second conductive plug formed on said first interlayer dielectric film but at a position separated from said second conductive plug;
wherein said capacitor includes a lower electrode, a capacitance layer and an upper electrode sequentially forming on said conductor.

3. The semiconductor device as recited in claim 2, wherein said conductor is of a plug shape.

4. A semiconductor device as recited in claim 2, wherein said conductor is located in said second interlayer dielectric film, but is separated from a region right above said first conductive plug.

5. A semiconductor device comprising:
a capacitor contact interlayer film formed in a lower layer where a capacitor is to be provided;
a capacitor contact formed in said capacitor contact interlayer film to be electrically connected to a cell contact;
a contact interlayer film formed on said capacitor contact interlayer film so as to cover said capacitor contact;
a contact formed in said contact interlayer film;
a capacitor including a lower electrode, a capacitance layer and an upper electrode, formed so as to be electrically connected to said capacitor contact;
wherein said contact formed in said contact interlayer film is constituted of a double stack including a first contact and a second contact directly connected to said first contact; and
a bottom of said lower electrode is coplanar with a bottom of said contact.

6. The semiconductor device as recited in claim 5, wherein said capacitor includes a metal plug constituted of a same material as that of said first contact, in a lower layer of said lower electrode of said capacitor.

7. The semiconductor device according to claim 6, wherein said metal plug is formed at a different position from that of said capacitor contact.

8. A semiconductor device comprising:
a semiconductor substrate;
a transistor formed on said semiconductor substrate;
a first dielectric film formed on said transistor;
a plurality of first conductive plugs formed in said first interlayer dielectric film and connected to said transistor;
a second dielectric film formed on said first dielectric film;

a second conductive plug formed in said second dielectric film and connected to a first one of said plurality of first conductive plugs;

a conductor having a same material as that of said second conductive plug and being separate from said second conductive plug;

a capacitor directly connected to a second one of said plurality of first conductive plugs, said capacitor including a lower electrode, a capacitance layer and an upper electrode sequentially formed on said conductor, a bottom of said lower electrode being coplanar with a bottom of said conductor;

a third dielectric film formed on said second dielectric film; and a plurality of third conductive plugs formed in said third dielectric film, a first one of said plural third conductive plugs being connected to said capacitor and a second one of said plural third conductive plugs being connected to said second conductive plug.

9. The semiconductor device as claimed in claim 8, wherein the plural first conductive plugs comprise a first sub-plug comprising said first one of said plural first conductive plugs and a second sub-plug contacting said capacitor.

10. The semiconductor device as claimed in claim 8, wherein said second dielectric film comprises an etch-stopper layer.

* * * * *